Sept. 17, 1963 A. J. MONCRIEFF-YEATES 3,104,188

SOLID STATE SOLAR GENERATOR

Filed Jan. 9, 1961

ALEXANDER J. MONCRIEFF-YEATES,
INVENTOR.

BY

Barkelew & Lewis

United States Patent Office 3,104,188

Patented Sept. 17, 1963

3,104,188

SOLID STATE SOLAR GENERATOR

Alexander J. Moncrieff-Yeates, Altadena, Calif., assignor to Giannini Controls Corporation, Duarte, Calif., a corporation of New York Filed Jan. 9, 1961, Ser. No. 81,512
7 Claims. (Cl. 136—89)

This invention has to do generally with improved solid state devices for converting energy of electromagnetic radiation into electrical form by means of the photovoltaic effect.

The invention may utilize radiation from many different sources. It is particularly effective as a solar generator, and may be so described for definiteness, but without implying any necessary limitation upon its scope.

Solar generators of electrical energy are useful for many purposes, especially when only moderate amounts of power are required at remote locations. For example, they have proved particularly valuable for supplying electrical power to instruments and communications equipment on man-made satellites.

Much attention has recently been given to solid state solar generators in which a photovoltage is produced by the action of light falling upon a PN junction, which is formed between two bodies of semiconductor material of P and N types, respectively. However, the materials that are otherwise most suitable for such PN junctions tend to absorb radiation rapidly, so that only a small fraction of the incident radiation reaches the actual junction. Moreover, a large part of the electrical energy produced at the barrier layer of the junction tends to be converted into heat by the relatively high resistance of the semiconductor material on both sides of the junction. Efforts to reduce that resistance, as by high doping of the semiconductor material, tend to reduce the carrier mobilities and lifetimes, and to reduce the thickness of the barrier layer, further reducing the fraction of incident light that is usefully absorbed.

The present invention largely avoids such disadvantages of a PN junction by utilizing instead the photovoltaic effect produced at a junction between a metal and a semiconductor. The existence of that effect is, of course, well known, but is usually considered to produce too low a voltage to be useful for power devices. It has now been discovered, however, that by utilizing suitable combinations of materials a photovoltage of satisfactory magnitude can be developed at a metal-semiconductor junction. Moreover, the properties of the selected materials permit the attainment of further important and novel advantages.

In accordance with one aspect of the invention, a junction is formed between crystalline cadmium sulfide, cadmium selenide or cadmium telluride and a suitable metal of high work function capable of forming a barrier layer with the crystal. An electrode is provided in contact with the crystal adjacent the barrier layer.

In accordance with a further aspect of the invention, conduction through the body of the crystal between the barrier layer and the electrode is facilitated by treating the crystal to make it photoconductive, and illuminating not only the barrier layer but also the photoconductive body of the crystal.

A further aspect of the invention provides novel cell configurations which are particularly compact and efficient. A plurality of units may be formed closely adjacent each other in a single crystal element, adjacent cells being separated eelctrically by the relatively high resistance of non-illuminated zones of the semiconductor material, from which light is cut off by suitable shielding structures.

A further aspect of the invention provides electrical connections through the body of a semiconductor material by locally treating the material to increase its conductivity. Particularly in very thin crystals, that procedure permits great economy of the crystal area and facilitates forming a large number of photovoltaic cells in a single piece of crystal.

A full understanding of the invention and of its further objects and advantages will be had from the following description of certain illustrative manners in which it may be carried out. The particulars of that description, and of the accompanying drawings which forms a part of it, are intended only as illustration and not as a limitation upon the scope of the invention, which is defined in the appended claims.

Figure 1:
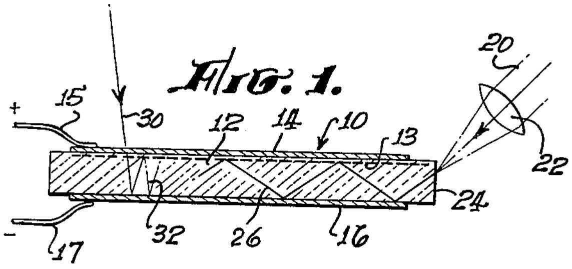
FIG. 1 is a schematic drawing, partly in section, representing an illustrative embodiment of the invention.

An illustrative power cell 10 in accordance with the invention is represented in transverse section in FIG. 1. A thin plate of semiconductive material is indicated at 12. Plate 12 typically comprises essentially a single crystal of cadmium sulfide, which may be produced, for example, by known procedures such as those described in U.S. Patent 2,916,678, issued on December 8, 1959, to Richard H. Bube. The body of plate 12 is treated to make it photoconductive, so that the conductivity of the semiconductor material is low when in the dark and is relatively high when illuminated. Techniques for making crystals of cadmium sulfide, selenide and telluride photoconductive, as by doping with small amounts of suitable impurities, are well known and need not be described in detail.

One face of plate 12 carries a metallic film 14 of a metal which forms a barrier or depletion layer at the semi-conductor surface. Nickel, chromium and platinum are illustrative of the metals that may be employed in film 14 for producing barrier layer 13, and are particularly suitable for the purpose. Gold and silver may also be used effectively, but yield a somewhat lower voltage. Since the barrier layer is typically extremely thin, it cannot be represented accurately in a drawing, even at the exaggerated transverse scale that is employed in FIG. 1. However, the barrier formed between the metal and semiconductor is represented schematically by the dashed line 13. Metal film 14, in addition to producing barrier layer 13, is sufficiently conductive to function also as an electrode.

The opposite face of plate 12 carries an electrode 16, preferably of a type that forms a substantially ohmic contact with the semiconductor. Such an electrode may be formed in known manner, for example by vacuum deposition of a film of indium, gallium, or tin under suitable conditions. Electrodes 14 and 16 are provided with electrical leads 15 and 17, respectively. Such leads may be connected to the metallic films in conventional manner, as by soldering or pressure welding. A protective insulating coating, not explicitly shown, may be applied over the films 14 and 16 if desired, for example by painting with a solution of a suitable plastic material in a volatile solvent. As will appear more fully, it is usually preferable to employ a transparent material for such coating.

The particular metals mentioned above in connection with films 14 and 16 have the further advantage that they can be deposited by known vacuum deposition techniques to form films of accurately controlled extent and thickness. In particular, such films may be made thick enough to reflect substantially all light incident upon them, or thin enough to transmit a large fraction of such light. The electrical conductivity of such layers, even when quite transparent, is satisfactory for their described function as electrodes.

In accordance with the invention, incident radiation is directed and controlled in such a way that it performs two distinct functions. First, it illuminates barrier layer 13, producing a voltage across that layer by photovoltaic action. Second, it illuminates the inner body of semiconductor plate 12, rendering the same conductive. The illuminated portion of plate 12 extends continuously between barrier layer 14 and electrode film 16, providing a conductive path along which the electrical resistance is low compared to the dark resistance of the semiconducting material. That conductive path transmits electric power developed at barrier layer 13 to electrode 16 for delivery to line 17. By thus utilizing illumination both for developing power and for facilitating its delivery across the body of cell 10 to output electrodes 15 and 17, the present invention avoids the excessive resistive power losses of previously available solar cells.

The described distribution of incident illumination may be obtained by various optical means. In accordance with one aspect of the invention, both metallic films 14 and 16 are made thick enough to reflect substantially all radiation incident upon them from within the body of semiconductor 12. A beam 20 of incident radiation is directed, as by suitable optical means represented schematically at 22, upon an edge surface 24 of plate 12. That edge surface may be polished or otherwise treated to admit the incident radiation into the interior of plate 12, where it is reflected back and forth between the opposing metal films 14 and 16, as indicated schematically at 26 for a typical single ray, until completely absorbed.

That optical arrangement causes the incident light to pass repeatedly through barrier layer 13, so that a correspondingly large fraction of the light is absorbed within that layer, generating carriers and producing a photovoltage. At the same time, the entire thickness of plate 12 is illuminated, producing a conductive path between the illuminated portion of barrier layer 13 and electrode 16.

Illumination may also be supplied to the semiconductor plate through one of its side faces. For that purpose the metal film 14 or 16 on the selected face is made partially transparent, the opposite film being preferably highly reflecting. Incident light then passes through barrier layer 13, and the unabsorbed light is reflected back to pass through the layer a second time. Illumination of that type is represented schematically by the ray 30, entering illustratively through film 14 and reflected by film 16. An appreciable fraction of the incident beam may experience multiple reflections, as indicated at 32. If desired, the same cell may be illuminated through one or both faces, as at 30, and also through an edge, as at 20.

It is often desirable to connect a large number of power cells in series, in order to provide power at increased voltage. In accordance with a further aspect of the present invention, a large number of cells can be formed from a single plate-like crystal of semiconductor material by segmenting the electrode films correspondingly on both faces of the plate. The respective cells are preferably isolated electrically from each other within the body of the semiconductor by providing suitably positioned zones in which photoconduction is prevented, as by cutting off illumination from those zones. For example, opaque shields of insulative material may be deposited on the plate faces between the electrode segments. Such shields not only insulate adjacent electrode segments on the plate surface, but cut off face illumination and darken the underlying body of photoconductor, isolating the interior portions of adjacent cells.

Figure 2:
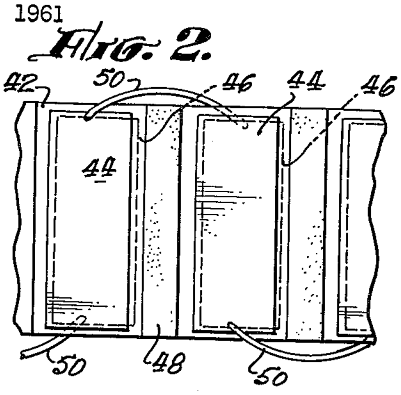
FIG. 2 is a fragmentary plan representing an illustrative assembly of cells in accordance with the invention.
Figure 3:
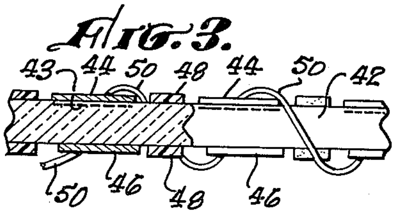
FIG. 3 is a side elevation of the structure of FIG. 2.

Illustrative structure of that type is shown schematically in FIGS. 2 and 3. Electrode segments 44 of barrier layer forming type are arranged in spaced relation on one face of semiconductor plate 42. Ohmic electrode segments 46 are formed on the other face of plate 42, opposite the respective segments 44. Segments 44 and 46 are shown slightly displaced for clarity of illustration. Opposite pairs of unlike segments form photovoltaic cells, which may be connected together by suitable leads in any desired arrangement in parallel or in series. As illustratively shown, the leads 50 connect each electrode segment to the segment of opposite type of an adjoining cell, so that the photovoltages of the respective cells add. The leads 50 may alternate between the two side edges of the cell assembly, as illustratively shown, or may all be placed at the same edge. Leads 50 are shown for clarity of illustration as free wires, but may, if desired, be adhered throughout their length to the surface of the assembly, or may pass through notches or small holes cut in the crystal plate for greater compactness and durability. Opaque insulative shields are shown at 48, applied to the plate faces between electrode segments in position to shade the body of the photoconductive material 42 between cells. Those shields may comprise black paint of any suitable composition, such as nigrosine black in amyl acetate, for example. Shields of very narrow width and accurate position can be deposited by vacuum deposition of any suitable material, such, for example, as antimony trisulfide or selenium, which are effectively nonconductive and highly light absorbing.

A cell assembly such as that of FIGS. 2 and 3 may be illuminated either from one or both faces or from a side edge, as already described in connection with FIG. 1, shields 48 being extended over the side edge of the crystal in the latter instance.

Figure 4:
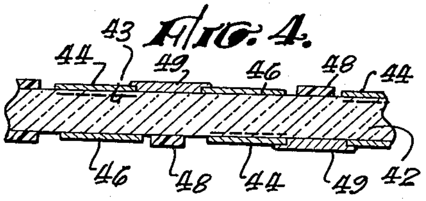
FIG. 4 is a side elevation corresponding to FIG. 3, but representing a modification.

An alternative assembly structure is shown schematically in FIG. 4. In that structure the electrode segments on each face are alternately barrier forming electrodes 44 and ohmic electrodes 46. The shield formations on each face are then alternately opaque insulative shields 48, which may be like those of FIG. 3, and electrically conductive opaque shields 49. The conductive shields may be formed in any desired manner. For example, they typically comprise relatively thick areas of film of the same type as one of the electrodes, or they may be formed, at least in part, by overlapping of the adjacent unlike electrode segments. Such overlapping is readily produced when the electrode segments are deposited by suitable dimensioning and placement of the respective segmnets.

Figure 5:
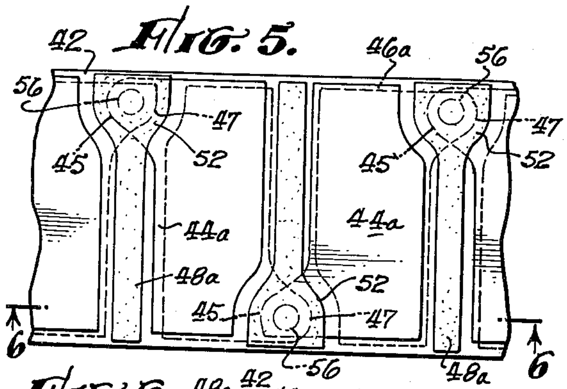
FIG. 5 is a plan corresponding generally to FIG. 2, but representing a further modification.
Figure 6:
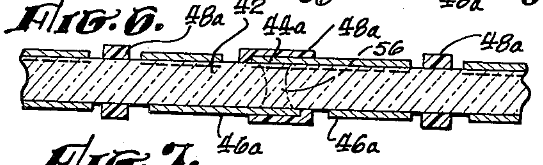
FIG. 6 is a section on the line 6—6 of FIG. 5.
Figure 7:
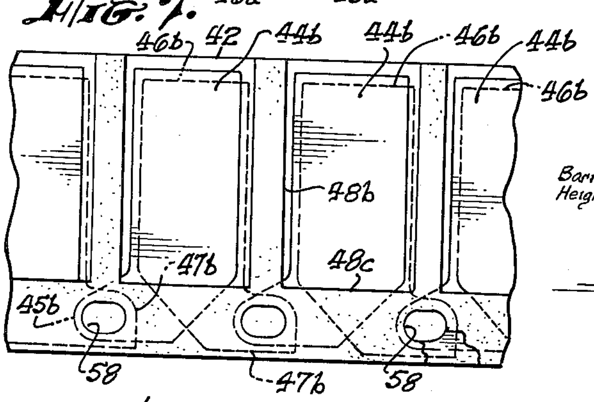
FIG. 7 is a plan corresponding generally to FIG. 5, but representing a further modification.

FIGS. 5 to 7 illustrate a further aspect of the invention, FIGS. 5 and 6 showing one arrangement and FIG. 7 a second arrangement of parts. In FIGS. 5 and 6, the barrier layer forming electrode segments **44*a* on one crystal face correspond generally to segments 44 of FIGS. 3 and 4; and ohmic contact forming electrode segments 46*a* on the other crystal face correspond generally to segments 46 of FIGS. 3 and 4. Opaque shield areas 48*a* of FIGS. 5 and 6 are enlarged at one end, as at 52, the enlarged ends of alternate shields lying adjacent opposite side edges of crystal 42. The area of each enlarged shield portion is overlapped by extensions of the electrode segment 44*a* on one side of the shield and the electrode segment 46*a* on the other side of the shield, such extensions being represented at 45 and 47, respectively. The extensions 45 and 47** are on opposite faces of the crystal.

In one form of the invention the body of crystal lying between each pair of electrode extensions 45 and 47 is treated locally to render it relatively conductive even when not illuminated. Such local regions of conductive crystal are represented at 56, dot-dash lines being employed in FIG. 6 to indicate schematically that the boundaries of the conductive regions are ordinarily not sharply defined. As seen best in FIG. 6, conductive regions 56 provide electrical connections between the electrode 44*a* of one cell and the electrode 46*a* of an adjacent cell, thus replacing the leads 50 of FIGS. 3 and 4.

The conductive regions 56 are typically produced at definitely determined locations of the crystal plate before deposition of either the electrode segments 44*a* and 46*a* or the light shields 48*a*. The electrode segments and shields are then deposited, as by conventional vacuum deposition, through suitably shaped and positioned masks, in the indicated relation to regions 56.

Conductive regions 56 may be produced, for example, by depositing on one or both crystal faces at each selected point a layer of tri-valent substance such as gallium, indium, aluminum or boron, for example. Such deposition of the metals mentioned may be localized by use of a suitable mask in known manner. The thickness of the deposited layer is not very critical, about 0.005 mm. being usually sufficient to provide from $10^{-6}$ to $10^{-4}$ atoms of metal per crystal atom. The metal is then caused to diffuse from the surface into the body of the crystal by heating the crystal to accelerate the natural rate of diffusion. The time and temperature for such firing depends upon many factors, including in particular the crystal thickness and the degree of conductivity required. In general, firing for a few hours at 400 to 500° C. is satisfactory for the extremely thin crystals that are preferably employed. With such crystals, typically as thin as about 0.1 mm., the metal tends to diffuse through the entire thickness of the crystal with relatively little lateral spreading, so that the conductive region produced is effectively limited to the region directly beneath the initially deposited surface layer.

After the described diffusion step, the electrode segments may be deposited directly over any metal remaining on the crystal face, such metal tending to improve the contact between electrode and conducting region. Light shields 48*a* are then applied on both faces of the assembly as illustrated if both faces are to be illuminated. When only one face is to be illuminated, the light shields on the other face may be omitted if desired.

The enlarged portion of each light shield amy be apertured, if desired, directly above the region 56. Light then penetrates the crystal body at that region, further increasing the conductivity and facilitating current flow between cells. The shaded portion of the body of crystal surrounding each region 56 remains essentially insulating, electrically isolating each conductive column 56 from the adjoining cells. When current carrying requirements are not excessive, sufficient conductivity in regions 56 may be produced by such illumination. The described local treatment of such regions to render them conductive may then be omitted.

FIG. 7 represents a modified elecrtode and shield arrangement in which shiled apertures 58 produce electric connections between adjacent cells by photoconductivity, as just described. Those connections are arranged all adjacent the same edge of the crystal. It is then convenient to extend the end enlargements of shields 48*b* to form a continuous shield along that crystal edge, as at 48*c*. The barrier layer forming electrodes 44*b* on the upper crystal face and those of the ohmic electrodes 46*b* on the lower face are typically arranged as shown at 45*b* and 47*b*, respectively. The particular arrangements shown are merely illustrative, the invention permitting great flexibility of design to meet special requirements of space, current, voltage and the like for particular applications.

Figure 8:
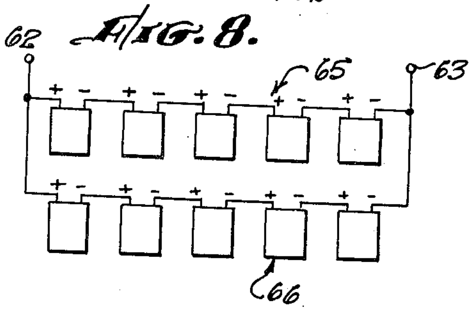
FIG. 8 is a schematic drawing illustrating typical electrical connection of a plurality of cells.

Cell assemblies such as have been described are typically mounted in closely adjacent relation in the path of a radiation beam. The cell assemblies may, for example, be embedded by known techniques in transparent plastic with suitable electrical terminals to which the electrode leads are connected. A particular advantage of the invention is the ease with which cell units of the type described may be connected in different details arrangements of series and parallel to provide any desired combination of voltage and power output. An illustrative arrangement of that type is represented schematically in FIG. 8, wherein two banks 65 and 66 of five cells each are connected in parallel between output terminals 62 and 63. In actual practice, power can be produced at voltages of several hundred volts, for example, by including in each series circuit an appropriate number of cell units.

Figure 9:
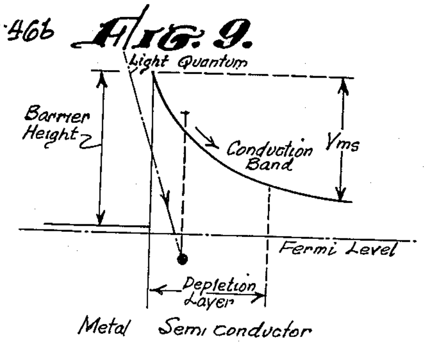
FIG. 9 is a schematic potential diagram illustrating a typical barrier layer in accordance with the invention.

FIG. 9 is a schematic potential diagram representing a barrier layer between a metal and a semiconductor. Current carriers are generated in the depletion layer at the surface of the semiconductor, producing free electrons in the conduction band. Those electrons tend to travel into the interior of the semiconductor, where the potential is lower, thereby developing a photovoltage. As seen from the diagram, the maximum value of the resulting photovoltage $V_{ms}$ is the difference of work functions between the metal and semiconductor minus the potential difference between the Fermi level and the bottom of the conduction band in the semiconductor. That potential difference may be increased by selection of individual semiconductor crystals for which the Fermi level closely approaches the conduction band.

It has been found that junctions can be constructed between crystals of cadmium sulfide, selenide or telluride and suitable metals that yield a photovoltage as high as approximately 0.5 volt. That value is only slightly lower than the voltage typically produced by a junction of PN type between two bodies of semiconductor material. That small voltage difference is more than outweighed by the novel advantages of employing metal-semiconductor junctions of suitable type in accordance with the present invention.

I claim:

1. A device for converting energy of electromagnetic radiation into electrical power, comprising in combination a body of semiconducting material selected from the group consisting of cadmium sulfide, cadmium selenide and cadmium telluride, a metal element electrically contacting the body and forming therewith a barrier layer, electrode means forming a substantially ohmic contact with the body in spaced relation to the metal element, said semiconducting body containing minor amounts of impurities which render it photoconductive, means for irradiating simultaneously the barrier layer and a portion of the body that extends continuously between the barrier layer and the electrode means, means acting to shield from radiation a portion of the semi-conducting body adjacent the irradiated portion thereof, said shielded portion forming a resistive barrier that guides the electric power to the electrode means, and circuit means connected to the metal element and the electrode means for carrying electric power developed by photovoltaic action at the barrier layer and conducted through the irradiated portion of the semiconducting body.

2. A device for converting energy of electromagnetic radiation into electrical power, comprising in combination a body of semiconductive material that is photoconductive and capable of transmitting radiation, a plurality of metal elements and a plurality of electrode means contacting the body surface in mutually spaced relation, the metal elements forming barrier layers and the electrode elements forming substantially ohmic contact with the body, means for simultaneously irradiating the barrier layers to produce photovoltages and irradiating portions of the body extending continuously from the barrier layers to respective electrode elements to produce conductive paths therebetween and thereby form respective cell units, means acting to shield from radiation portions of the photoconductive body between said irradiated portions to form insulative boundaries between the cell units, and circuit means interconnecting the cell units in series.

3. A device as set forth in claim 2, and wherein said circuit means comprises an electrically conductive region of said body extending continuously from the metal element of one cell to the electrode element of an adjacent cell.

4. A device as set forth in claim 2, and wherein said circuit means comprises an electrically conductive region of said body extending continuously from the metal element of one cell to the electrode element of an adjacent cell, said conductive region being surrounded by portions of the body that are shielded from radiation.

5. A device as set forth in claim 2, and wherein said circuit means comprises an aperture in said shielding means in position to transmit radiation to a region of said body that extends continuously from the metal element of one cell to the electrode element of an adjacent cell and that is surrounded by portions of the body that are shielded from radiation.

6. A device for converting energy of electromagnetic radiation into electrical power, comprising in combination a thin plate-like body of semiconductive material, said body having a plurality of mutually spaced regions that are electrically conductive and that extend continuously between the two opposite faces, a plurality of mutually insulated metal plate elements on one face of the body that form barrier layers therewith, a corresponding plurality of metal electrode elements on the opposite face of the body that form substantially ohmic contact therewith, each of said electrode elements lying predominantly in opposed relation to one of the plate elements and forming therewith a cell, the plate element of each cell and the electrode element of an adjacent cell having respective portions that overlap and electrically contact one of said regions of the body, and means for irradiating the barrier layers to produce photovoltages in each cell.

7. A device for converting energy of electromagnetic radiation into electrical power, comprising in combination a thin crystal of semiconducting material selected from the group consisting of cadmium sulfide, cadmium selenide and cadmium telluride, barrier means electrically contacting one face of the crystal and forming therewith a barrier layer electrode means electrically contacting the opposite face of the crystal and forming therewith a substantially ohmic contact, said crystal being capable of transmitting radiation and said barrier means and said electrode means reflecting substantially all radiation incident thereon through the crystal, means for irradiating an edge face of the crystal to produce a photovoltage at the barrier layer, and circuit means connected to the barrier means and to the electrode means for carrying electric current caused by the photovoltage and transmitted through the irradiated body of the crystal.

References Cited in the file of this patent

UNITED STATES PATENTS

| | | |
|---|---|---|
| 2,688,564 | Forgue | Sept. 7, 1954 |
| 2,820,841 | Carlson et al. | Jan. 21, 1958 |
| 2,999,240 | Nicoll | Sept. 5, 1961 |